United States Patent [19]

Delacourt et al.

[11] Patent Number: 5,355,000
[45] Date of Patent: Oct. 11, 1994

[54] ASSYMETRIC QUANTUM WELL INFRARED DETECTOR

[75] Inventors: Dominique Delacourt, Paris; Michel Papuchon, Villebon; Francois Chevoir, Vincennes, all of France

[73] Assignee: Thomson-CSF, Puteaux, France

[21] Appl. No.: 95,044

[22] Filed: Jul. 22, 1993

Related U.S. Application Data

[63] Continuation of Ser. No. 714,610, Jun. 13, 1991, abandoned.

[30] Foreign Application Priority Data

Jun. 26, 1990 [FR] France .................. 90 08004

[51] Int. Cl.$^5$ ......................... H01L 31/0352
[52] U.S. Cl. ......................... 257/14; 257/17; 257/21; 257/185
[58] Field of Search ............... 357/16, 4 SL; 257/21, 257/14, 17, 185

[56] References Cited

U.S. PATENT DOCUMENTS 4,745,452  5/1988  Sollner ..................... 357/16

FOREIGN PATENT DOCUMENTS

407250A1  1/1991  European Pat. Off. .
9006596   6/1990  PCT Int'l Appl. .

OTHER PUBLICATIONS

Applied Physics Letters, vol. 50, No. 25, Jun. 22, 1987, pp. 1814–1816, K. K. Choi, et al., "Multiple Quantum Well 10 $_n$M GaAs/Al$_x$Ga$_{1-x}$As Infrared Detector with Improved Responsivity".

"New Mode of IR Detection Using Quantum Wells", vol. 45, No. 6, Sep. 15, 1984, pp. 649–651; D. D. Coon et al.

"Photovoltaic Quantum Well Infrared Detector", vol. 52, No. 20, May 16, 1988, pp. 1701–1703; K. W. Goosen et al.

Primary Examiner—William D. Larkins
Attorney, Agent, or Firm—Oblon, Spivak, McClelland, Maier & Neustadt

[57] ABSTRACT

An electromagnetic wave detector has several stacks of layers of semiconducting materials. Each stack constitutes an asymmetrical quantum well with stepped barrier and has two energy levels, one of which is located beneath the energy level of the intermediate barrier step while the other is located above it. Means are used to apply an electric field to the structure.

6 Claims, 7 Drawing Sheets

ASSYMETRIC QUANTUM WELL INFRARED DETECTOR

This application is a continuation of application Ser. No. 07/714,610, filed on Jun. 13, 1991, now abandoned.

BACKGROUND OF THE INVENTION

The invention relates to an electromagnetic wave detector and, more particularly, to a wave detector using semiconductors with quantum wells.

At present, several approaches may be used to detect an electromagnetic wave. These approaches include the use of:

1) Semiconductor materials with appropriate forbidden band widths;
2) Doped semiconductor materials;
3) Associated III-V semiconductor materials with multiple quantum well structures.

The first approach (1) consists in the use of semiconductor materials whose forbidden band width is smaller than the photon energy $h\upsilon$ of the wave to be detected, thus enabling the electrons to go from the valence band to the conduction band. These electrons are then collected by means of an external circuit, and are the source of a photocurrent that enables detection.

The second approach (2) relates to the use of semiconductor materials with a greater forbidden band width than the photon energy to be detected, which can be done by resorting to a doping of the materials used. This doping can be used to bring out an electron donor level corresponding to the impurities that are the source of the doping. From this energy level, which is closer to the conduction band than is the top of the valence band, it will be possible to produce electron transitions towards the conduction band so that the electrons, that have undergone these transitions under the effect of an electromagnetic field, are made free and detectable.

Figure 1A:
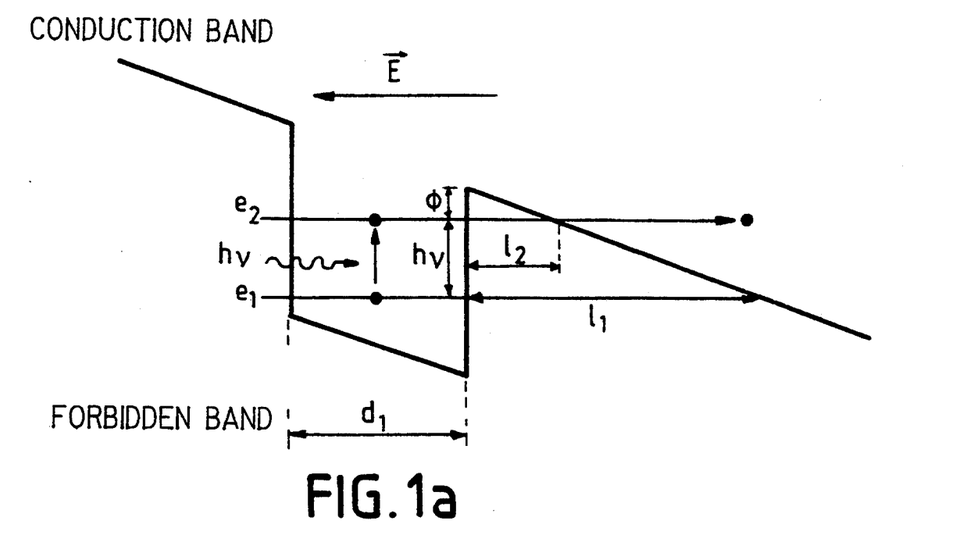
FIGS. 1a, 1b, 2a, 2b and 3 show devices known in the prior art and already described here above.

The third approach (3) is based on the occurrence of electron transitions between permitted energy levels ($e_1$ and $e_2$) within the conduction band of semiconducting quantum structures. FIG. 1a shows an example of this type of transition in a well exhibiting two permitted discrete energy levels for the electrons. Through the application of an electrical field to this type of configuration, it is the electrons located at the second quantum level that will tend to be extracted. Thus the collection, in the external electrical circuit, of these electrons coming from the second quantum level to which they have been taken by an illumination ($h\upsilon$) enables the detection of this illumination. The invention relates to a detector corresponding to this third approach.

The type of detectors to which the invention can be applied is therefore based on the occurrence, under the effect of an illumination $h\upsilon$, of electron transitions within the conduction band of the semiconductor quantum wells. The principle of the working of these detectors is therefore that of using these transitions to place the electrons, initially located at the fundamental level of the well, at an energy level that enables them to leave the well easily under the effect of an applied electric field. Up till now, two configuration have been proposed to make this type of operation possible. A first configuration consists in the use of a quantum well with two permitted energy levels $e_1$ and $e_2$ for the electrons in the conduction band. As shown in FIG. 1, under the effect of an illumination represented by its photon energy $h\upsilon$, electron transitions may take place from the level $e_1$ towards the level $e_2$. The application of an electric field E to the structure then enables the electrons located at the level $e_2$ to be made to cross the potential barrier $\Phi$ so that they are extracted from the well. The electrons then take part in a photocurrent that enables the detection of the illumination as is described in the following documents:

- B. F. Levine, K. K. Choi, C. G. Bethea, J. Walker and R. J. Malik, "New 10 $\mu$m infrared detector using intersubband absorption in resonant tunnelling GaAsAs superlattices", APL 50 (16), Apr. 20, 1987, p. 1092;
- K. K. Choi, B. F. Levine, C. G. Bethea, J. Walker and R. J. Malik, "Multiple quantum well 10 $\mu$m GaAs/Al$_x$Ga$_{1-x}$As infrared detector with improved sensitivity", APL 50 (25), Jun. 20, 1987, p. 1814.
- B. F. Levine, K. K. Choi, C. G. Bethea, J. Walker and R. J. Malik, "Quantum well avalanche multiplication initiated by 10 $\mu$m intersubband absorption and photoexcited tunnelling", APL 51 (12), Sep. 21 1987, p. 934.

Figure 1B:
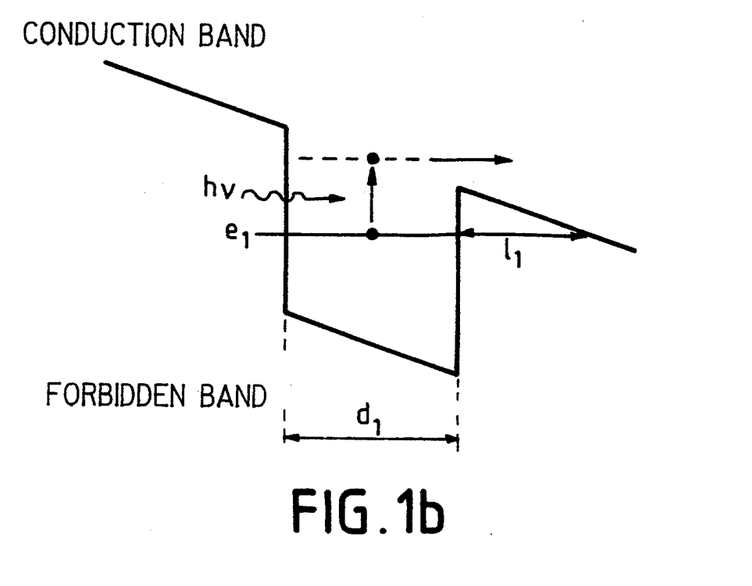

A second configuration is based on the use of a well having only one level, separated from the top of the barrier forming the well by an energy close to the photon energy $h\upsilon$ of the electromagnetic energy to be detected as shown in FIG. 1b and described in the following documents:

- B. F. Levine, C. G. Bethea, G. Hasnain, J. Walker, R. J. Malik, "GaAs/AlGaAs quantum-well long-wavelength infrared (LWIR) detector with a detectivity comparable to HgCdTe", Elec. Letters, Vol. 24, No. 12, Sep. 6, 1988, p. 747.
- B. F. Levine, C. G. Bethea, G. Hasnain, J. Walker and J. Malik, in "High Detectivity D*=1.0×10$^{10}$ cm Hz/W GaAs/AlGaAs multiquantum well=8.3 $\mu$m infrared detector", APL 53 (4), Jul. 25, 1988, p. 296.

Figure 2A:
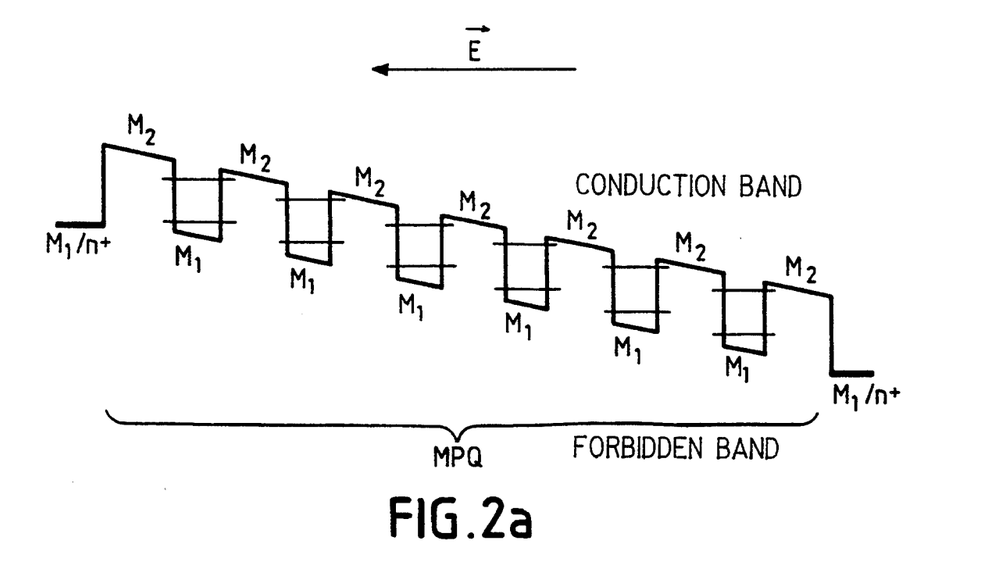
Figure 2B:
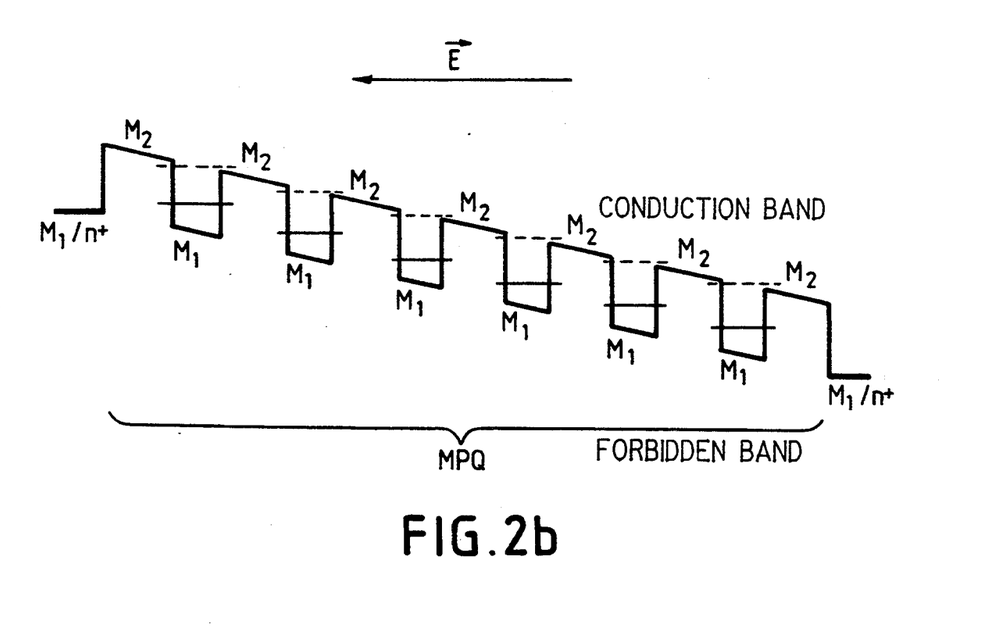

To obtain high absorption of the illumination to be detected, a large number of wells is used within the detectors based on this quantum principle, and this is done whatever the chosen configuration. Thus, the conduction band of these multiple quantum wells (MQWs) may be symbolized by FIGS. 2a and 2b corresponding respectively to the two types of transition that have just been referred to. This type of structure is based on the periodic stacking of layers of a first material $M_1$ and a second material $M_2$. The forbidden band widths of the two materials are different in order to obtain potential wells for the electrons in the conduction band. The contact layers located on each side of the periodic region designated by MQW may be constituted, for example, by layers of material $M_1$ with high n type doping, referenced $m_1/n+$. To increase the number of possible transitions, an n type doping of the zone MQW is generally resorted to.

Among the characteristics exhibited by these configurations, we may note the following elements in referring again to FIGS. 1a and 1b:

In the case of the configuration of FIG. 1a, the transitions occur between two levels located beneath the potential barrier separating the wells. Consequently, the electrons located on the two levels show a high degree of confinement in the width $d_1$ of the wells, whence a high transition efficiency between the two levels. For, the absorption due to the electron transitions between $e_1$ and $e_2$ is one of the elements governing the response of the detector. This absorption is proportional to the interaction dipole $\mu_z$ between the two levels. $\mu_z$ is written:

$$\mu_z = \int_{-\infty}^{+\infty} \psi_2(z)\,\psi_1(z)\,z\,dz$$

where $\Psi_1(z)$ and $\Psi_2(z)$ are the real electron wave functions attached respectively to the levels $e_1$ and $e_2$. Now, for a given well thickness, $\mu_z$ will be all the higher as the extensions of the two wave functions are close to each other. The working of this type of detector takes advantage of the difference in mobility in the direction perpendicular to the plane of the layers constituting the wells, between the electrons located at the level $e_1$ and those located at the level $e_2$. For, in order to be extracted from the well, the electrons located at the level $e_2$ have a potential barrier $\Phi$ to be crossed that is lower than the electrons located at the level $e_1$ retained, under the effect of a field, in the well by a barrier $\Phi + h\upsilon$. Furthermore, the width of this barrier is smaller ($l_2$) for the level $e_2$ than for the level $e_1$ ($l_1$), and this is so because of the potential profile communicated to the structure by the electric field used for the collection of the photo-electrons. Nevertheless, this potential barrier that has to be crossed limits the performance characteristics of the detector, for it restricts the difference in mobility in the transfer perpendicular to the semiconducting layers, between the electrons located at the level $e_1$ and those located at the level $e_2$, the two levels being separated by the energy $h\upsilon$ given by the central wavelength of the response curve of the detector.

If we now look at the structure of FIG. 1b, it is seen that the electrons excited by the electromagnetic field to be detected no longer have any barrier to cross in order to be extracted from the well: this favors their participation in the photocurrent. By contrast, the level to which the photoexcited electrons are taken from the level $e_1$ is not bound, and the probability of transition is far smaller than in the case of FIG. 1a, taking into account the very low localization, in the zone of the well, of the electrons located at this free level. In other words, the wave function associated with this level is not confined to the zone of the well, and the interaction dipole $\mu_z$ is far smaller.

Figure 3:
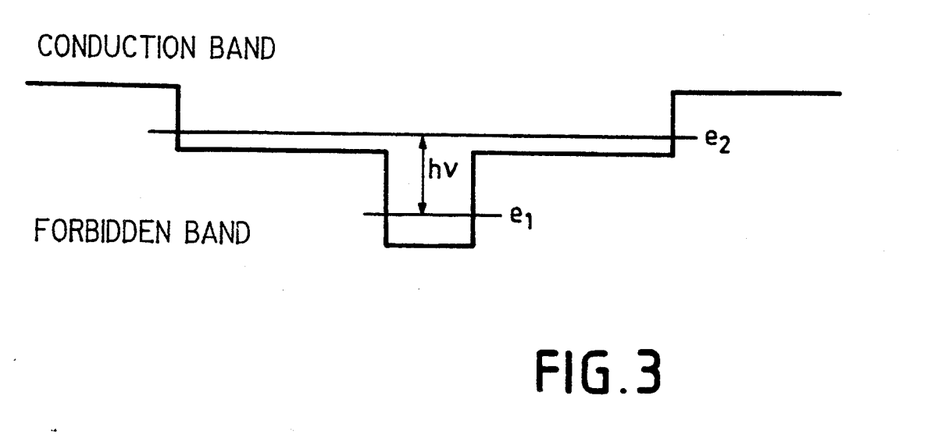

Again, as a point of comparison between the two known configurations of FIGS. 1a and 1b, it may also be pointed out that, in the case of FIG. 1a, the distance $l_2$ depends directly on the field $\vec{E}$ applied to the structure. The more it is sought to diminish $l_2$, the more is it necessary to apply a strong field $\vec{E}$ and the more is $l_1$ diminished, the consequence of which is to increase the dark current of the structure. This problem is different in the case of FIG. 1b, where the weakest fields may be enough for the efficient collection of the photoexcited carriers but where, as we have seen, there arises the problem of the low probability of transition between the fundamental level of the well and the excited virtual level. To associate, on the one hand, a high response due to a high probability of transition between a fundamental level and an excited level and, secondly, a very low dark current, an approach using symmetrical wells with double stepped barrier, as shown in FIG. 3, has been proposed in the French patent application No. 89 08961. This approach is based on the differences between the extension of the wave function $\Psi_2$ attached to the level $e_2$ and that of the wave function $\Psi_1$ attached to the level $e_1$, to favor the the extraction from the well of the electrons located at the level 1 while, at the same time, preserving a high degree of confinement for the electrons located at the level 1. However, it is possible to even further promote this behavior by using asymmetrical wells as described here below.

To resolve the problem raised, namely to obtain a high response and a weak dark current on one and the same detector based on the occurrence of intraband transitions within the conduction band of multiple quantum well structures, the barrier to be crossed has to be very different for the electrons located on the level excited and for those located on the fundamental level.

SUMMARY OF THE INVENTION

The invention therefore relates to an electromagnetic wave detector comprising:
a stack of layers of semiconducting material constituting a quantum well, the asymmetrical potential profile of which shows a stepped barrier, namely it has an intermediate barrier step, said stack possessing two energy levels, one of which is lower than the energy level of the intermediate barrier step while the other level is higher than the energy level of this intermediate barrier step;
means to apply an electric field to the structure;
means to detect an electric current that are connected to the terminals of the structure;

More precisely, the invention relates to an electromagnetic wave detector, comprising:
a) a semiconducting structure possessing at least one stack of a first layer, second layer, third layer and fourth layer, the forbidden band widths of which make it possible to obtain the following profile of potential energy corresponding to the bottom of the conduction band for the electrons:
the lowest energy for the second layer;
intermediate energy for the third layer, this third layer constituting an internal barrier;
higher values of energies for the first and fourth layers constituting the barriers of the wells; said structure being such that:
the energy corresponding to a first permitted electron level is lower than the intermediate energy of the bottom of the conduction band of the material of the third layer;
the energy corresponding to the second electron level is between the intermediate energy of the bottom of the conduction band of the material of the third layer and the potential energies of the bottom of the conduction band of the materials of the first and fourth layers;
b) means to apply an electric field to the structure, oriented in the direction going from the third layer towards the second layer;
c) means to detect an electric current that are connected to the terminals of the structure.

BRIEF DESCRIPTION OF THE DRAWINGS

The different features and characteristics of the invention shall appear more clearly in the following description, given as an example, and in the appended figures, of which.

DETAILED DESCRIPTION OF THE INVENTION

Figure 4A:
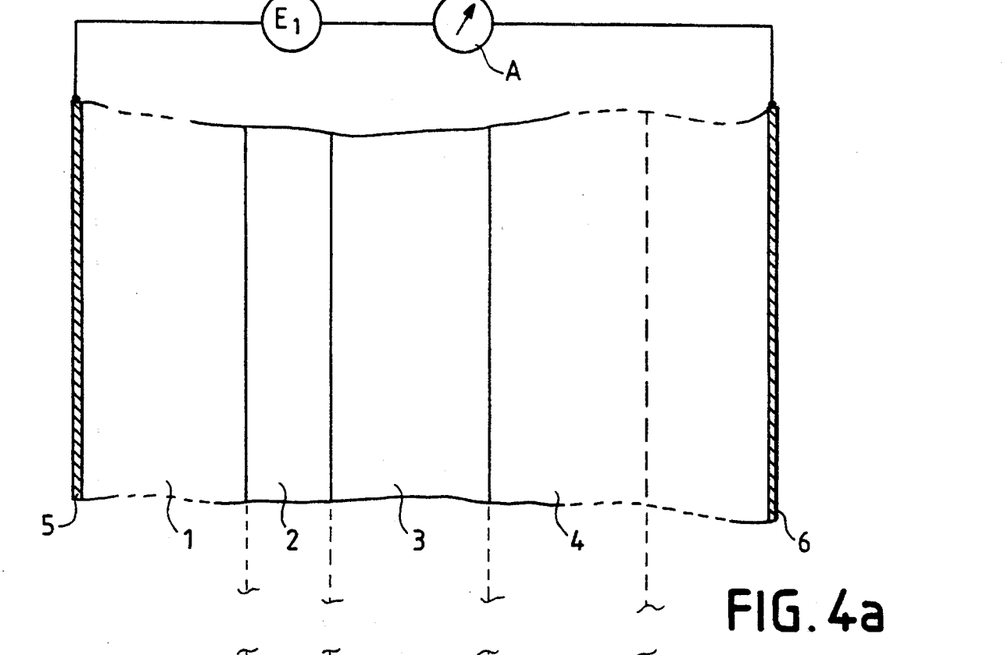
FIGS. 4a, 4b and 5 show an exemplary embodiment according to the invention.
Figure 4B:
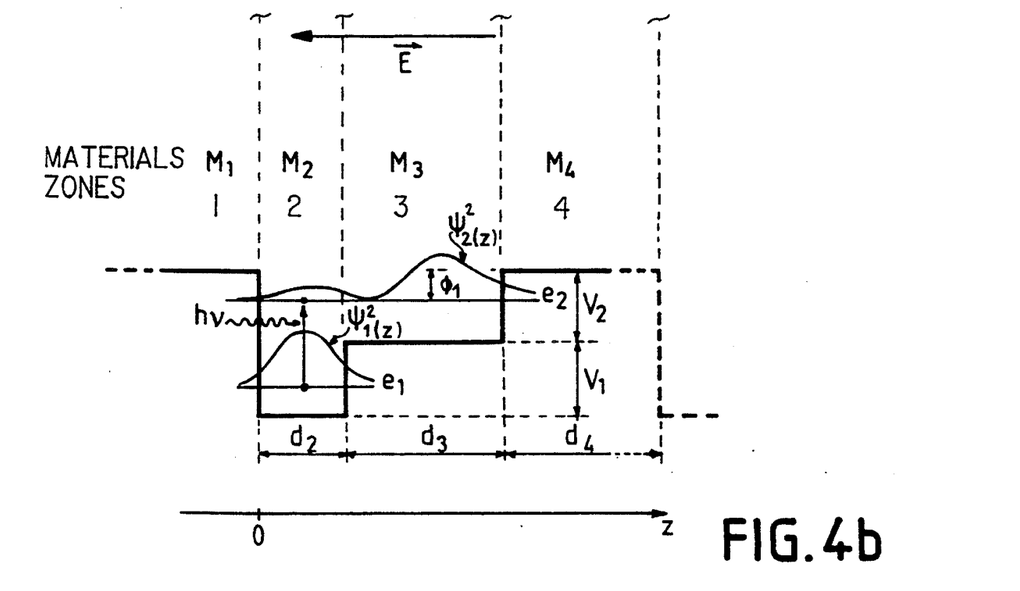

According to the invention, the electromagnetic wave detector is made by means of layers of semiconducting materials so as to set up at least one quantum well exhibiting a particular profile of potential as shown in FIG. 4b. A well such as this, configured in this way, may be said to be "asymmetrical with stepped barrier". This type of profile makes it possible to reduce the value of the electric field to be applied to obtain the asymmetry needed for the extraction, from the well, of the electrons located at the level $e_2$.

FIG. 4a shows a simplified exemplary embodiment of the invention having only one asymmetrical quantum well with stepped barrier.

This device comprises:
a layer 2 made of a semiconducting material, wherein the potential energy of the bottom of the conduction band for the electrons is the lowest of the structure. This layer 2 constitutes the deepest part of the quantum well;
a layer 3 made of a semiconducting material, with intermediate energy, said layer constituting an intermediate barrier step;
two layers 1 and 4 sandwiching the two layers 2, 3 and having energy greater than the intermediate energy of the layer 3. The two layers 1 and 4 therefore constitute the higher barrier steps.

Furthermore, on each side of this structure, contact layers (not shown) made, for example, by n type doping, bear electrodes 5 and 6.

To the electrodes 5 and 6, there is connected a device E1 for the application of an electric field $\vec{E}$ in such a way that this field is oriented in the direction that goes from the layer 3, constituting the intermediate barrier step, towards the layer 2 constituting the well.

A current measuring device A is also connected to the electrodes 5 and 6.

The composition of the layers and their thicknesses are such that the structure has a first permitted electron level (1), the energy of which is between the energy of the bottom of the conduction band of the layers 2 and 3. The structure has has a second electron level $e_2$, the energy of which is greater than the energy of the bottom of the conduction band of the layer 3 and smaller than the energy of the bottom of the conduction band of the layer 4. A conduction band profile such as this is shown in FIG. 4b. The difference between the levels $e_1$ and $e_2$ should correspond to the photon energy $h\nu$ to be detected.

Figure 5:
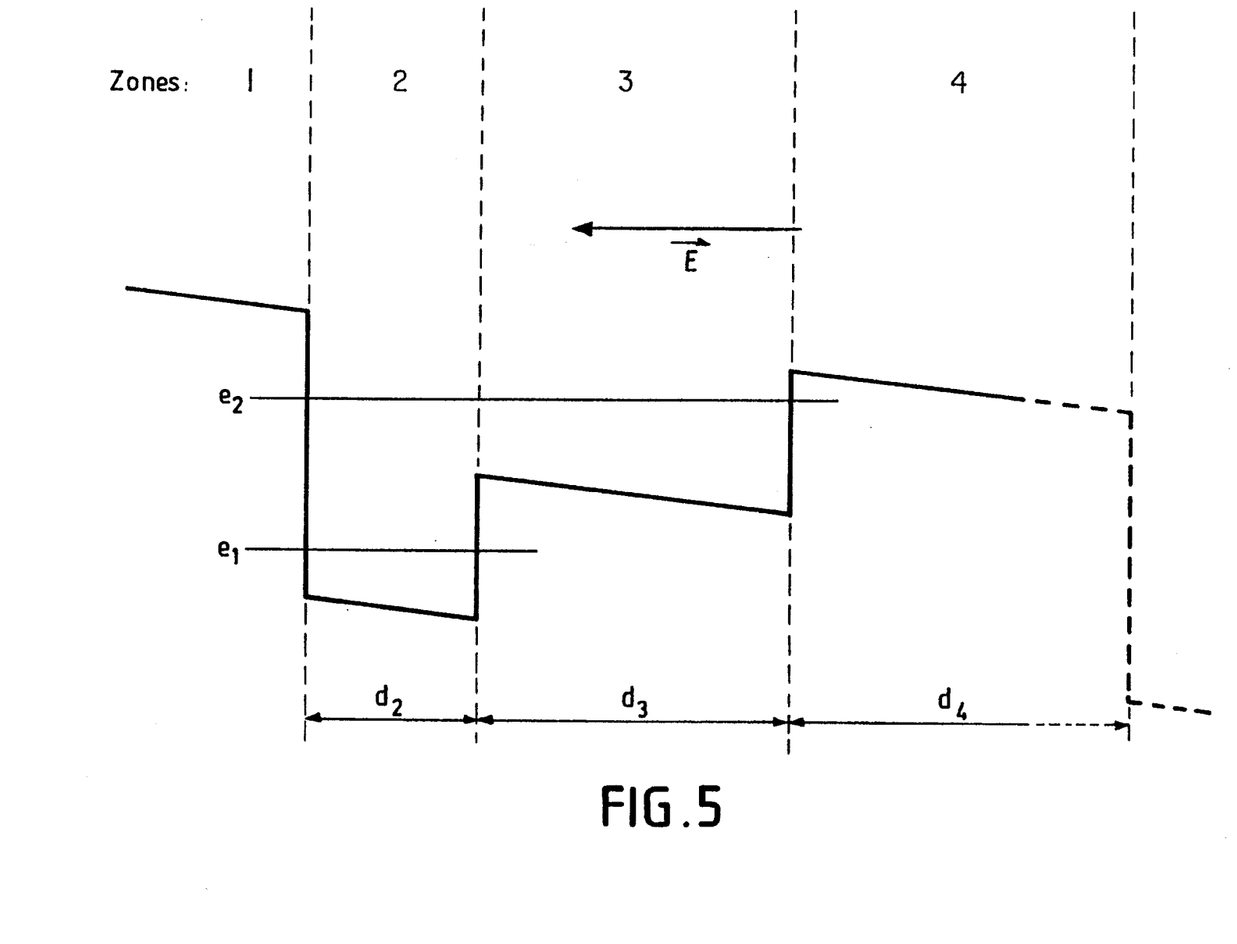

When an electric field $\vec{E}$ is applied to the structure by the device E1, the profile of the conduction band gets inclined as shown in FIG. 5 so as to allow the conduction of electrons from the level $e_2$ towards the electrode 6.

The working of the structure of the invention shall now be described.

As shown in FIG. 4, the device preferably has several stacks of layers constituting a stack of quantum wells.

The device of the invention is therefore a detector based on the occurrence of electron transitions between two permitted quantum levels $e_1$ and $e_2$ for the electrons within the potential well, the profile of which is shown in FIG. 4. The association of this type of well to cumulate the desired effect on each of these wells leads to a form of conduction band, namely a potential energy profile, also shown in FIG. 4b, in which the major parameters of the structure are indicated. The energy difference $h\nu$ between the levels $e_1$ and $e_2$ depend chiefly on the parameters $d_2, d_3, V_1, V_2$. This difference may also be modified by the width $d_4$ of the highest barrier, should said barrier be thin enough to permit the coupling between the levels $e_2$ of two consecutive wells. For the designing of the structures, the values of these different parameters should therefore be determined so that the device effectively has high absorption and high detectivity for the desired photon energy $h\nu$. The invention is based on two principles. The first one is related to the fact that the level $e_1$ is at a potential energy lower than $V_1$ and that the level $e_2$, for its part, is at a potential energy between $V_1$ and $V_1+V_2$. In practice, it will be sought to obtain a high value for $\Phi_1$ in order to limit the dark current. It should further be noted that the making of this structure calls for at least three materials $M_1, M_2, M_3$ with different forbidden band widths. However, stepped barriers using a greater number of materials are within the scope of the invention. The second principle on which the invention is based is related to the asymmetry of the well. This asymmetry, associated with the energy position of the levels $e_1$ and $e_2$ in relation to $V_1$ and $V_1+V_2$, creates a pronounced shift in the probability of the presence $\Psi_2(z)$ of the electrons on the level $e_2$, towards the stepped barrier. Thus, in the absence of an electric field, the photoexcited electrons on the level $e_2$ tend to be located in the zones 3 and 4, while the electrons of the level $e_1$ are localized chiefly in the zone 2 as indicated by the density of probability $\Psi_1(z)$ that is associated with the level $e_1$ and is shown, like $\Psi_2(z)$, in FIG. 4. Upon the application of an electric field $\vec{E}$ directed as shown in FIG. 3 which also illustrates the corresponding variation of the potential profile of the well, this situation furthers the extraction, from the exterior of this well, of the electrons located at the level $e_2$ while at the same time keeping the electrons of the level $e_1$ confined to the interior of the deep well (level 2). It must be noted that, to come within the framework of the invention, the sign of the field applied with respect to the profile of the well should correspond to the case presented by FIG. 5. In other words, the field applied should correspond to a reduction in the potential energy of the electrons, namely to an increase in potential, on the stepped barrier side (layers 3 and 4).

This type of detector with quantum wells uses an n type doping providing for a populating, with electrons, of the level $e_1$ that is sufficient for the transitions $e_1$ to $e_2$ to be effectively produced. However, when these devices work as detectors, the wells get emptied by the extraction therefrom of the electrons photoexcited by the energy wave $h\nu$ to be detected. This loss of electrons is compensated for by the dark current that flows in the structure. The value of the invention is that it derives the maximum benefit from this necessary but parasitic current in order to optimize the response/dark current ratio and the detectivity. In fact, if FIG. 5 is referred to again, it is seen that the extraction of the electrons located at the level $e_2$ is very considerably furthered by the spatial distribution of these electrons given by the density of pobability of presence indicated in FIG. 4b. This point, associated with the fact that the transitions occur between two bound levels, furthers the response of these detectors. At the same time (see FIGS. 4b and 5), the electrons that are not photoexcited, hence the electrons that have remained at the level $e_1$, remain confined to the region 2. Their participation in the dark current is thus limited. The profile of the wells that is the object of the invention thus provides for the most efficient compromise between the two configurations of FIGS. 1a and 1b shown here above. In effect, since the two levels brought into play are bound, the interaction dipole $\mu_z$ remain high and close to its value in wells of the type shown in FIG. 1a. By contrast, the probability of extraction of the electrons located at the level $e_2$ is higher than in a simple well. The invention thus makes it possible to approach the dark current that may be obtained with wells of the type shown in FIG. 1b.

Figure 6A:
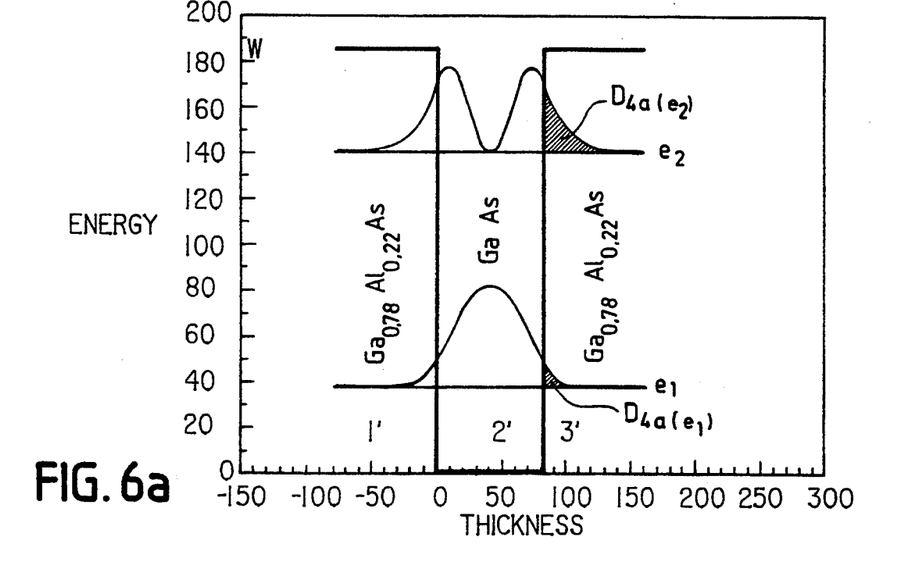
FIG. 6a shows an example of materials and thicknesses of layers used to make a known device.
Figure 6B:
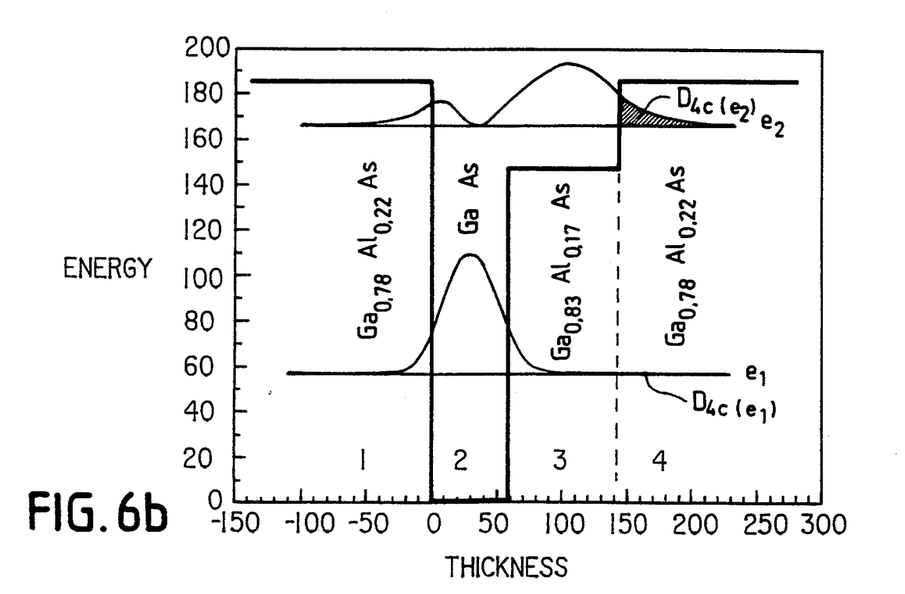
FIG. 6b shows an example of materials and thicknesses of layers used to make the invention.

FIG. 6b shows an exemplary well profile made out of GaAlAs tupe alloys that comes within the scope of the invention. FIG. 6a also shows a known type of symmetrical well with non-stepped barrier having, with respect to FIG. 6b, the same energy difference between $e_1$ and $e_2$ and barriers (zones 1' and 4') equivalent to the end barriers (zones 1 and 4 corresponding to the layers 1 and 4). These figures also show the densities of probability of the presence of the electron along the axis Oz. In both cases, we have computed the probability of the presence $D_4$ of the electron in the zones 4' and 4 corresponding to the layers 4' and 4 (FIGS. 6a and 6b respectively). In the case of FIG. 6a, the following are obtained for $e_1$ and $e_2$:

$$D_{4a}(e_1) = 3.39 \cdot 10^{-2}$$

$$D_{4a}(e_2) = 1.68 \cdot 10^{-1}$$

and $$R_{4a} = D_{4a}(e_2)/D_{4a}(e_1) = 4.96$$

This ratio $R_4(a)$ expresses the difference of penetration of the electrons in the zone 4 depending on whether they are placed on the level $e_2$ or on the level $e_1$ and hence, in the case of FIG. 6a, $R_4(a)$ gives account of the possibility of making an extraction, in a preferred way, of the electrons located at the level $e_2$. We shall now compute this same ratio $R_4$, but in the case of FIG. 6b corresponding to the invention:

$$D_{4b}(e_1) = 2.88 \cdot 10^{-5}$$

$$D_{4b}(e_2) = 1.16 \cdot 10^{-1}$$

$$R_4(b) = D_{4b}(e_2)/D_{4b}(e_1) = 4.0277 \cdot 10^4$$

The value of the invention can be seen: it makes it possible to favor the difference in behavior in terms of extraction from the well, between the levels $e_1$ and $e_2$. However, in the case of FIG. 6b, the interaction dipole $\mu_z$ (defined here above) is lower than in the case of FIG. 6a. Indeed we have:

$$\mu_z(a) = 2.311 \text{nm.e}$$

$$\mu_z(b) = 1.554 \text{nm.e}$$

Now, it is $\mu^2_z$ that governs the absorption related to the transitions $e_1$ and $e_2$ and therefore has a direct influence on the response of the detector. Thus, it is necessary to compare:

$$R_4(a)\mu^2_z(a) = 2.65 \cdot 10^3$$

and $$R_4(b)\mu^2_z(b) = 9.73 \cdot 10^6$$

The example of the invention shown in FIG. 6b therefore remains very substantially favorable since these two values have a ratio of the order of $10^3$.

It is also possible to make a computation, in both cases and under an applied field, of the ratio $\rho$ between the time of leakage to the exterior of the well associated with the level $e_2$ ($\tau_2$) and that associated with the level $e_1$ ($\tau_1$). In the case of FIG. 6a, for an applied field such as $\tau_2(a) = 10^{-12}$s, we have:

$$(a) = \tau_{2(a)}/\tau_{1(a)} \approx 10^6$$

By contrast, in the case (b):

$$(b) = \tau_{2(b)}/\tau_{1(b)} \approx 10^9$$

The invention therefore makes it possible to gain a factor of $10^3$ on the ratio of the leakage time. Furthermore, the field to be applied to obtain $\tau_2 = 10^{12}$s is 0.35 mV/A in the case of FIG. 6a whereas it is only 0.15 mV/A in the case of the invention (FIG. 6b), thus favoring a reduction in the dark current for a given response.

For example, a preferred embodiment of the detector of the invention is shown in FIG. 6b and has a conduction band profile such as the one shown in FIG. 6b.

Figure 7:
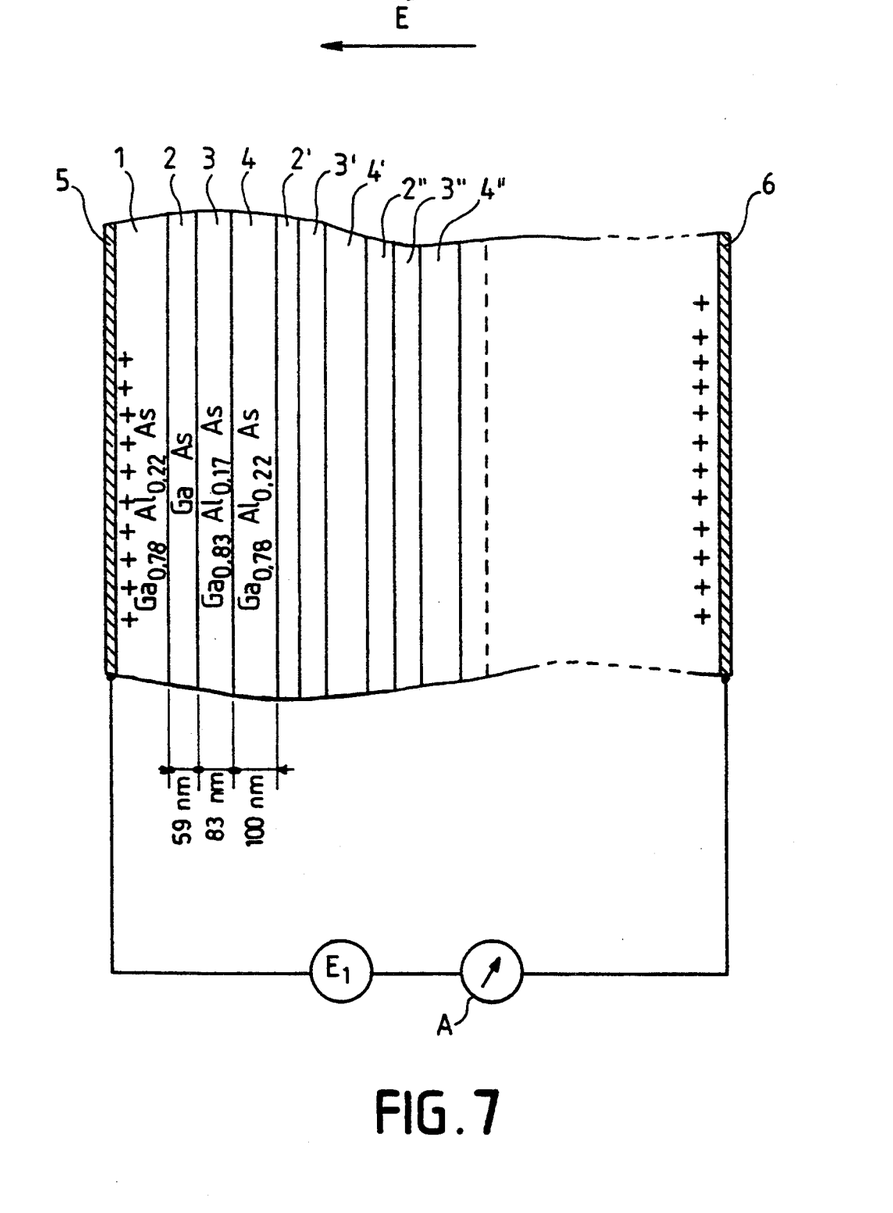
FIG. 7 shows a detailed exemplary embodiment of the device according to the invention.

The device of FIG. 7 has a stack of quantum wells, each constituted as follows:

Two layers 2 and 3, made of GaAs and $Ga_{1-y}Al_yAs$, respectively buried between two layers 1 and 2 of $Ga_{1-x}Al_xAs$.

With x between 0 and 1 (for example 0.22) y between 0 and x (for example 0.17)

The thickness of the layer 2 is between 1 and 10 nm (for example 6 nm).

The thickness of the layer 3 is between 2 and 20 nm (for example 6 nm).

The barrier 4 between two consecutive layers reasonably has a thickness of between 5 and 50 nm (for example 20 nm).

The electric field applied to the structure is oriented in the direction going from the layer 3 towards the layer 2.

The invention therefore relates to the field of the detection of an electromagnetic wave through the use of the electron transitions between discrete energy levels located in the conduction band of semiconducting quantum wells that may be associated in large numbers to increase the response of detectors of this type. At present, the existing approaches in this field cannot be used to make maximum use of the dark current needed to repopulate the wells with electrons. These known approaches make use of symmetrical simple wells with two bound levels $e_1$ and $e_2$ or with wells that are of the same type but have only one bound level $e_1$, the transitions then occurring from this level $e_1$ directly towards the continuum. The first approach furthers a major response because, as the two levels $e_1$, $e_2$ are bound, the probability of transition $e_1$ towards $e_2$ is high. The second approach furthers a low dark current but leads to lower responses, for the probability of transition $e_1$ towards the continuum is lower. The idea on which the invention is based consists in the use of wells that have two bound levels to favor the response but exhibit an asymmetrical potential profile obtained by using a stepped configuration of one of the two barriers forming the well. This particular profile enables an increase in the differentiation in terms of probability of extraction from the well, between the level $e_2$ and the level $e_1$, in order to further the departure, from the well, of the photoexcited electrons while at the same time limiting the dark current. Thus, the use of asymmetrical wells with a stepped barrier enables the response/dark current ratio to be increased.

The above description has been given purely by way of an example. Different variants may be contemplated without going beyond the scope of the invention. In particular, the numerical examples and the examples of materials have been given solely in order to illustrate the description.

What is claimed is:

1. An electromagnetic photo-current detector, comprising:
    an asymmetric quantum well having a first layer with a conduction band edge at a first energy, a second layer adjacent to the first layer so that inner surfaces of the first and second layers contact one another, said second layer having a conduction band edge at a second energy which is greater than said first energy, and third and fourth layers opposing one another and having a conduction band edges at energies which are greater than the second energy, the third and fourth layers contacting outer surfaces of the first and second layers, respectively;
    a constant voltage source;
    means for applying a constant voltage from said constant voltage source to the third and fourth layers; and
    means for detecting an electric current flowing across the asymmetric quantum well, wherein:
    thicknesses and conduction band energies of the first, second, third and fourth layers are such that fourth and fifth energies are allowed electron energies for electrons confined to the asymmetric quantum well, the fourth energy is less than the second energy and the fifth energy is greater than the second energy and less than conduction band edge energies of the third and fourth layers.

2. A detector according to claim 1, wherein:
    said means for applying a voltage comprises means for raising the conduction band edge energy of the third layer relative to the conduction band edge energy of the fourth layer.

3. A detector according to claim 1, wherein:
    the third layer and the fourth layer have the same band gap energy.

4. A detector according to claim 1, further comprising:
    a plurality of asymmetric quantum wells as recited in claim 1 which form a superlattice.

5. A detector according to claim 1, wherein said means for applying a voltage comprises:
    electrodes in electrical contact with external surfaces of a semiconductor structure which is integrally connected with the asymmetric quantum well.

6. A detector according to claim 1, wherein:
    the first layer comprises GaAs no Al substitution for Ga;
    the second layer comprises $Ga_{1-x}Al_xAs$;
    the third and fourth layers comprise $Ga_{1-y}Al_yAs$; and wherein $0<x<y$ and $0<y<1$.

* * * * *